US009787258B2

(12) United States Patent
Lam et al.

(10) Patent No.: US 9,787,258 B2
(45) Date of Patent: Oct. 10, 2017

(54) CIRCUITS AND DEVICES RELATED TO FAST TURN-ON OF RADIO-FREQUENCY AMPLIFIERS

(71) Applicant: SKYWORKS SOLUTIONS, INC., Woburn, MA (US)

(72) Inventors: Lui Lam, Lexington, MA (US); Vinu Govind, Reading, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 39 days.

(21) Appl. No.: 14/797,326

(22) Filed: Jul. 13, 2015

(65) Prior Publication Data

US 2016/0013760 A1    Jan. 14, 2016

Related U.S. Application Data

(60) Provisional application No. 62/024,087, filed on Jul. 14, 2014.

(51) Int. Cl.
| | |
|---|---|
| *H03F 3/16* | (2006.01) |
| *H03F 3/193* | (2006.01) |
| *H03F 1/02* | (2006.01) |
| *H03F 1/08* | (2006.01) |
| *H03F 3/72* | (2006.01) |

(52) U.S. Cl.
CPC ........... *H03F 3/193* (2013.01); *H03F 1/0277* (2013.01); *H03F 1/086* (2013.01); *H03F 3/72* (2013.01); *H03F 3/16* (2013.01); *H03F 2200/231* (2013.01); *H03F 2200/294* (2013.01); *H03F 2200/451* (2013.01); *H03F 2203/7215* (2013.01)

(58) Field of Classification Search
CPC .. H03F 1/0283; H03F 3/193; H03F 2200/231; H03F 2200/294; H03F 2200/451; H03F 1/0277; H03F 1/086; H03F 3/72; H03F 2203/7215; H03F 1/02
USPC ............................... 330/51, 277, 124 R, 295
See application file for complete search history.

(56) References Cited

U.S. PATENT DOCUMENTS

| | | | | |
|---|---|---|---|---|
| 4,390,851 | A * | 6/1983 | Higgins | H03F 3/1935 330/277 |
| 4,525,678 | A * | 6/1985 | Lehmann | H03F 3/193 330/277 |
| 4,890,069 | A * | 12/1989 | Duffalo | H03F 3/193 330/277 |
| 7,081,789 | B2 * | 7/2006 | Klemmer | H03F 1/30 327/362 |
| 7,795,959 | B2 * | 9/2010 | Chen | H03F 3/005 330/310 |

(Continued)

*Primary Examiner* — Khanh V Nguyen
(74) *Attorney, Agent, or Firm* — Chang & Hale LLP

(57) ABSTRACT

Circuits, methods and devices are disclosed, related to fast turn-on of radio-frequency (RF) amplifiers. In some embodiments, an RF amplifier circuit includes an amplification path implemented to amplify an RF signal, where the amplification path includes a switch and an amplifier. In some embodiments, each of the switch and the amplifier are configured to be ON or OFF to thereby enable or disable the amplification path, respectively. In some embodiments, the RF amplifier circuit includes a compensation circuit coupled to the amplifier, where the compensation circuit is configured to compensate for a slow transition of the amplifier between its ON and OFF states resulting from a signal applied to the switch.

20 Claims, 8 Drawing Sheets

(56) References Cited

U.S. PATENT DOCUMENTS

| | | | | |
|---|---|---|---|---|
| 7,847,629 B2* | 12/2010 | Chou | ............... | G11C 27/026 |
| | | | | 330/277 |
| 8,547,157 B1 | 10/2013 | Mangold et al. | | |
| 8,913,976 B2* | 12/2014 | Khatri | ............... | H03F 1/0277 |
| | | | | 455/287 |
| 9,154,356 B2* | 10/2015 | Tasic | ............... | H03G 3/20 |
| 2008/0106330 A1* | 5/2008 | Yoshida | ............... | H03F 3/387 |
| | | | | 330/10 |
| 2009/0212863 A1 | 8/2009 | Ishimaru | | |

\* cited by examiner

CIRCUITS AND DEVICES RELATED TO FAST TURN-ON OF RADIO-FREQUENCY AMPLIFIERS

CROSS-REFERENCE TO RELATED APPLICATION(S)

This application claims priority to U.S. Provisional Application No. 62/024,087 filed Jul. 14, 2014, entitled CIRCUITS AND METHODS RELATED TO FAST TURN-ON OF RADIO-FREQUENCY AMPLIFIERS, the disclosure of which is hereby expressly incorporated by reference herein in its entirety.

BACKGROUND

The present disclosure relates to radio-frequency amplifiers capable of fast turn-on.

DESCRIPTION OF THE RELATED ART

Many electronic devices require amplification of input radio-frequency (RF) signals to amplified output RF signals. Amplified output RF signals can be achieved through the use of RF amplifiers.

SUMMARY

In accordance with some implementations, the present disclosure relates to a radio-frequency (RF) amplifier circuit comprising an amplification path implemented to amplify an RF signal, the amplification path including a switch and an amplifier, each of the switch and the amplifier configured to be ON or OFF to thereby enable or disable the amplification path, respectively. The RF amplifier circuit further comprises a compensation circuit coupled to the amplifier, the compensation circuit configured to compensate for a slow transition of the amplifier between its ON and OFF states resulting from a signal applied to the switch.

In some embodiments, the amplification path of the RF amplifier circuit further includes a DC blocking capacitance implemented between the switch and the amplifier.

In some embodiments, each of the switch and the amplifier of the RF amplifier circuit includes a field-effect transistor (FET) having a gate, a source, and a drain. In some embodiments, each of a FET switch and a FET amplifier of the RF amplifier circuit is a silicon-on-insulator (SOI) device.

In some embodiments, a FET switch of the RF amplifier circuit is configured to be in an ON state to allow passage of the RF signal between the source and the drain upon an application of a positive edge switch signal to the gate. In some embodiments, a FET amplifier of the RF amplifier circuit is configured to receive the RF signal from a FET switch and a DC blocking capacitance at its gate and output the amplified RF signal through its drain or source. In some embodiments, the amplified RF signal is output through the drain of a FET amplifier.

In some embodiments, a FET amplifier of the RF amplifier circuit is configured to be turned ON to allow amplification of the RF signal upon an application of a positive edge switch signal to the gate.

In some embodiments, the signal applied to the switch includes a negative edge signal applied to the source and the drain of a FET switch of the RF amplifier circuit to improve insertion loss performance of the FET switch, the negative edge signal coupling with the FET amplifier through the DC blocking capacitance to result in the slow transition of the FET amplifier from the OFF state to the ON state.

In some embodiments, the compensation circuit of the RF amplifier circuit includes a DC blocking capacitance coupled to the gate of the FET amplifier. In some embodiments, a DC blocking capacitance of the compensation circuit of the RF amplifier circuit is configured to provide a capacitive coupling of a positive edge compensation signal to the gate of the FET amplifier to provide compensation for at least a portion of the capacitive coupled effect of the negative edge signal applied to the source and the drain of the FET switch.

In some embodiments, the compensation provided by the capacitive coupling of a positive edge compensation signal results in a faster transition of a FET amplifier of the RF amplifier circuit from the OFF state to the ON state.

In some embodiments, the capacitive coupling of the positive edge compensation signal to the gate of a FET amplifier of the RF amplifier circuit is configured to substantially cancel the capacitive coupled effect of the negative edge signal applied to the source and the drain of the FET switch.

In some embodiments, the amplifier of the RF amplifier circuit includes a low-noise amplifier (LNA). In some embodiments, a LNA of the RF amplifier circuit is configured to amplify received WLAN signals.

In some embodiments, the amplification path includes a common antenna port, and in some embodiments, the amplification path is configured to operate in a time-division duplexing mode.

The present disclosure also relates to a method for amplifying a radio-frequency (RF) signal. The method includes providing an amplification path for amplifying the RF signal, where the amplification path includes a switch and an amplifier, and each of the switch and the amplifier are configured to be ON or OFF to thereby enable or disable the amplification path, respectively. The method further includes providing a compensation signal to the amplifier to compensate for a slow transition of the amplifier between its ON and OFF states resulting from a signal applied to the switch.

According to some implementations, the present disclosure relates to a radio-frequency (RF) module that includes a packaging substrate configured to receive a plurality of components. The RF module further includes an RF amplifier circuit implemented on the packaging substrate, the RF amplifier circuit including an amplification path implemented to amplify an RF signal, the amplification path including a switch and an amplifier, each of the switch and the amplifier configured to be ON or OFF to thereby enable or disable the amplification path, respectively. The RF amplifier circuit further includes a compensation circuit coupled to the amplifier, where the compensation circuit is configured to compensate for a slow transition of the amplifier between its ON and OFF states resulting from a signal applied to the switch.

In some implementations, the switch and the amplifier of the RF module are implemented on a common die. In some implementations, a common die of the RF module is a silicon-on-insulator (SOI) die. In some implementations, the compensation circuit of the RF module is also implemented on the common die.

In some implementations, the amplifier of the RF module is a low-noise amplifier (LNA), and in some implementations, the RF module is a WLAN module.

According to some implementations, the present disclosure relates to a wireless device that includes an antenna configured to facilitate transmission and receive operations, and an RF amplifier circuit in communication with the antenna. The RF amplifier circuit includes an amplification path implemented to amplify an RF signal, where the amplification path includes a switch and an amplifier. Each of the switch and the amplifier are configured to be ON or OFF to thereby enable or disable the amplification path, respectively. The RF amplifier circuit further includes a compensation circuit coupled to the amplifier, where the compensation circuit is configured to compensate for a slow transition of the amplifier between its ON and OFF states resulting from a signal applied to the switch.

In some implementations, the amplifier is a low-noise amplifier (LNA) and the amplification path is configured to amplify the RF signal received through the antenna.

In some implementations, the RF amplifier circuit further includes a power amplifier (PA) path configured to amplify an RF signal to be transmitted. In some embodiments, each of the amplification path and the PA path of the wireless device, is coupled to the antenna.

In some embodiments, the RF amplifier circuit of the wireless device is configured to operate in a time-division duplexing mode. In some implementations, the RF amplifier circuit of the wireless device is configured to operate in one or more WLAN frequencies.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed are circuits, devices, systems, methods, and the like, related to fast turn-on of radio-frequency (RF) amplifiers. Although described in the context of fast turn-on, it will be understood that one or more features of the present disclosure can also allow fast turn-off of RF amplifiers.

Figure 1:
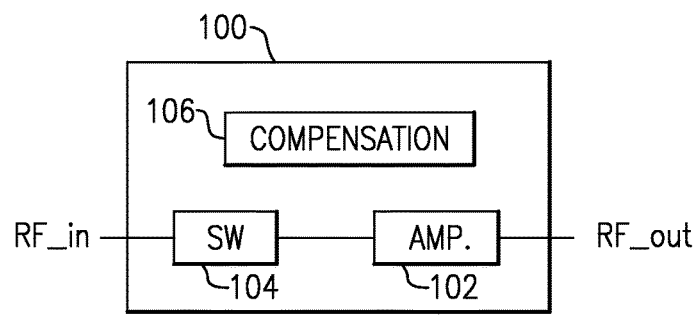
FIG. 1 shows a block diagram of an RF amplifier circuit configured to receive an input RF signal, RF_in, and generate an amplified RF signal, RF_out.

FIG. 1 shows a block diagram of an RF amplifier circuit 100 configured to receive an input RF signal (RF_in) and generate an amplified RF signal (RF_out). In many RF applications, such an amplification circuit can include a switchable amplification path that includes an amplifier 102 and a switch 104. Accordingly, the amplification path can be enabled by turning ON both of the switch 104 and the amplifier 102. Similarly, the amplification path can be disabled by turning OFF both of the switch 104 and the amplifier 102. As described herein, such turning ON and/or OFF of the amplifier 102 can suffer from delays which can in turn slow the operating speed of the amplifier circuit 100.

FIG. 1 further shows that the amplification circuit 100 can further include a compensation circuit 106 implemented to facilitate a faster transition of the amplifier 102 between its on and off states. For example, and as described herein in greater detail, the compensation circuit 106 can allow the amplifier 102 to be turned ON significantly faster.

Figure 2:
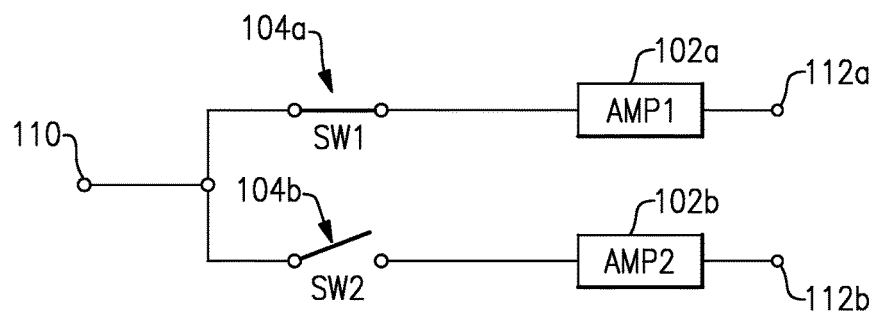
FIG. 2 shows an example architecture where fast turning ON and OFF of amplifiers is desirable.

FIG. 2 shows an example architecture where fast turning ON and OFF of amplifiers is desirable. Two example amplification paths are shown to share a common node 110. The first amplification path is shown to be between the common node 110 and a first node 112a, and include a first switch (SW1) 104a and a first amplifier 102a (Amp1). Similarly, the second amplification path is shown to be between the common node 110 and a second node 112b, and include a second switch (SW2) 104b and a second amplifier 102b (Amp2).

Figure 3:
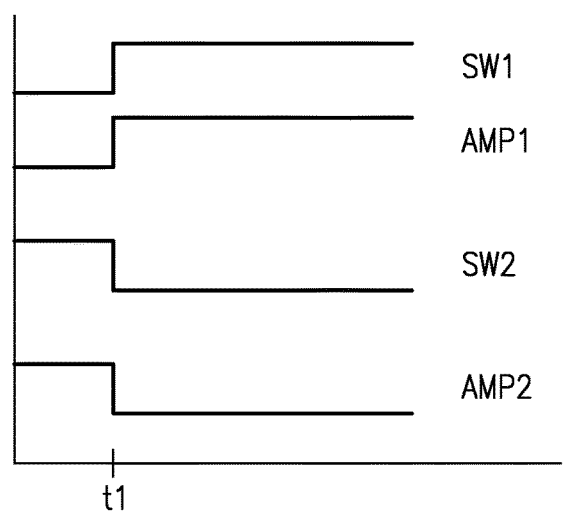
FIG. 3 shows example control signals applied to RF amplifiers.

In the example of FIG. 2, the first amplification path is shown to be enabled with the first switch 104a being ON, and the second amplification path is shown to be disabled with the second switch 104b being OFF. FIG. 3 shows examples of control signals that can be applied to the two amplification paths of FIG. 2, with an assumption that a high state corresponds to an ON state (and a low state corresponds to an OFF state) of a switch or an amplifier. Accordingly, each of the first switch 104a (SW1) and the first amplifier 102a (Amp1) is shown to be provided with a positive edge signal at time t1 so as to yield a high state. Similarly, each of the second switch 104b (SW2) and the second amplifier 102b (Amp2) is shown to be provided with a negative edge signal at time t1 so as to yield a low state.

With the example control signals of FIG. 3, each of the two amplifiers (Amp1 and Amp2) of FIG. 2 can be turned ON or OFF repeatedly. In some RF applications, such enabled/disabled states of the two amplification paths can be implemented such that the common node 110 is an antenna port, to thereby allow two amplification paths to share a common antenna. The first amplification path can be, for example, a receive (Rx) path such that the first amplifier 102a (Amp1) is a low-noise amplifier (LNA). The second amplification path can be, for example, a transmit (Tx) path such that the second amplifier 102b (Amp2) is a power amplifier (PA). In such an example configuration, the Rx and Tx operations can be implemented in a time-division duplexing (TDD) configuration.

Figure 4:
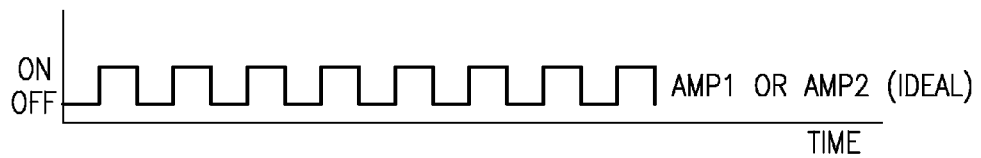
FIG. 4 shows an example ON/OFF sequence where transitions between such ON/OFF states are assumed to occur in an ideal manner so as to yield step-functions, for a given amplifier.

In such a TDD configuration, one amplifier is ON while the other is OFF. For example, when an Rx operation is enabled, the LNA can be ON and the PA be OFF. When a Tx operation is enabled, the LNA can be OFF and the PA be ON. For a given amplifier (Amp1 or Amp2), FIG. 4 shows an example ON/OFF sequence where transitions between such ON/OFF states are assumed to occur in an ideal manner so as to yield step-functions.

Figure 5:
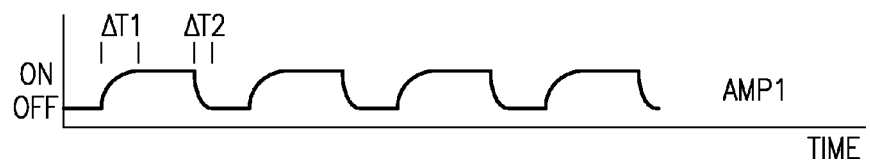
FIG. 5 shows example timing diagrams for two RF amplifiers.
Figure 5:
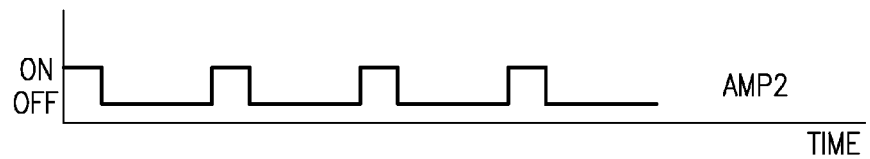
Figure 5:
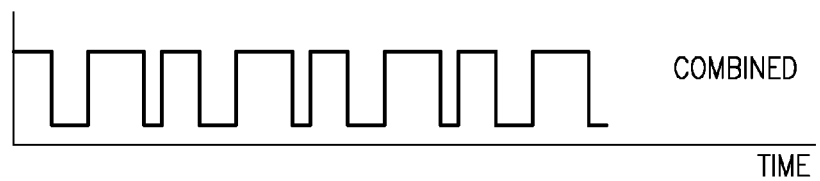

However, either or both of the two amplifiers may not transition in such an ideal manner. For example, and as depicted in FIG. 5, suppose that the first amplifier (Amp1) has a turn-on delay of ΔT1 and a turn-off delay of ΔT2. Accordingly, each cycle of the first amplifier includes dead times associated with ΔT1 and ΔT2, thereby limiting the first amplifier's operating speed.

When the two amplifiers (Amp1 and Amp2) are operated in the example TDD configuration, the operating speed of the second amplifier (Amp2) is also impacted, even if the second amplifier is able to have an ideal ON/OFF performance. As shown in FIG. 5, such a speed limitation on the second amplifier (Amp2) is due to the fact that only one of the Rx and Tx operations can be performed through the same antenna in the TDD configuration. Accordingly, the second amplifier (Amp2) can transition from ON to OFF substantially immediately at the beginning of the OFF-to-ON transition of the first amplifier (Amp1). However, the second amplifier (Amp2) needs to wait to turn ON while the first amplifier (Amp1) turns OFF.

Based on the foregoing example, FIG. 5 further shows a duty cycle of the combination of the first and second amplifiers (Amp1 and Amp2) operating in, for example, TDD configuration. As described herein, the delay(s) in turning ON and OFF of at least one amplifier can impact the speed of the amplifier circuit. If both of the amplifiers suffer from such delays, the impact on speed can be even worse.

Figure 6:
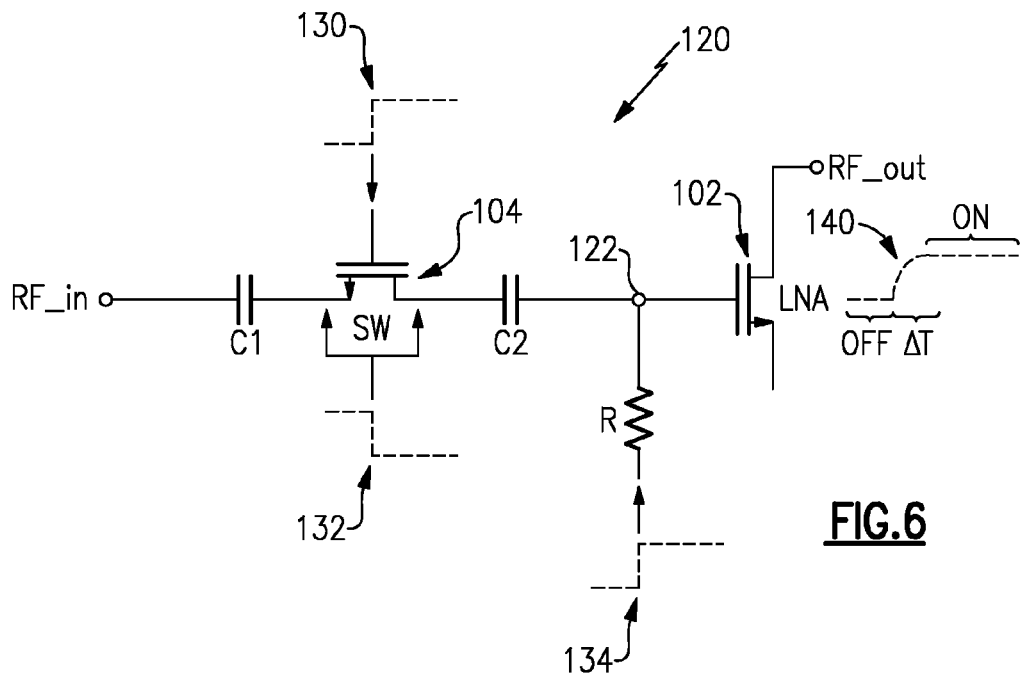
FIG. 6 shows an example amplification configuration where a delayed turn-on of an amplifier can result to thereby reduce its operating speed.

FIG. 6 shows an example amplification configuration 120 where a delayed turn-on of an amplifier 102 (e.g., and LNA) can result to thereby reduce its operating speed. An input RF signal (RF_in) is shown to be provided to a gate of an LNA 102 (e.g., a FET) through a blocking capacitance C1, a switch 104 (SW) (e.g., a FET), and a blocking capacitance C2. The blocking capacitances C1, C2 are typically configured to provide DC-blocking functionality to isolate the DC biasing points of the switch 104 (SW) and the LNA 102. The amplified RF signal is shown to be output (RF_out) through a drain of the LNA 102.

To enable such an amplification path, the switch 104 (SW) can be turned ON by application of a positive edge signal 130. Similarly, the LNA 102 can be turned ON by application of a positive edge signal 134 to the gate node 122 through, for example, a gate resistance R. The two positive edge signals 130, 134 may or may not be supplied from a common source, and their magnitudes may or may not be the same.

To minimize or reduce insertion loss associated with the FET switch 104 (SW), the drain and source of the FET are often applied with a negative edge signal 132. Such a negative edge signal typically couples through the blocking capacitance C2 and counteracts the positive edge signal 134, to thereby slow down the turn-on of the LNA 102. Such a delayed turn-on of the LNA is depicted by a trace 140 that transitions from an OFF state to an ON state through a delay period ΔT. Such a slow turn-on is typically undesirable, and can be problematic in some RF applications such as wireless-LAN (WLAN) applications.

Figure 7:
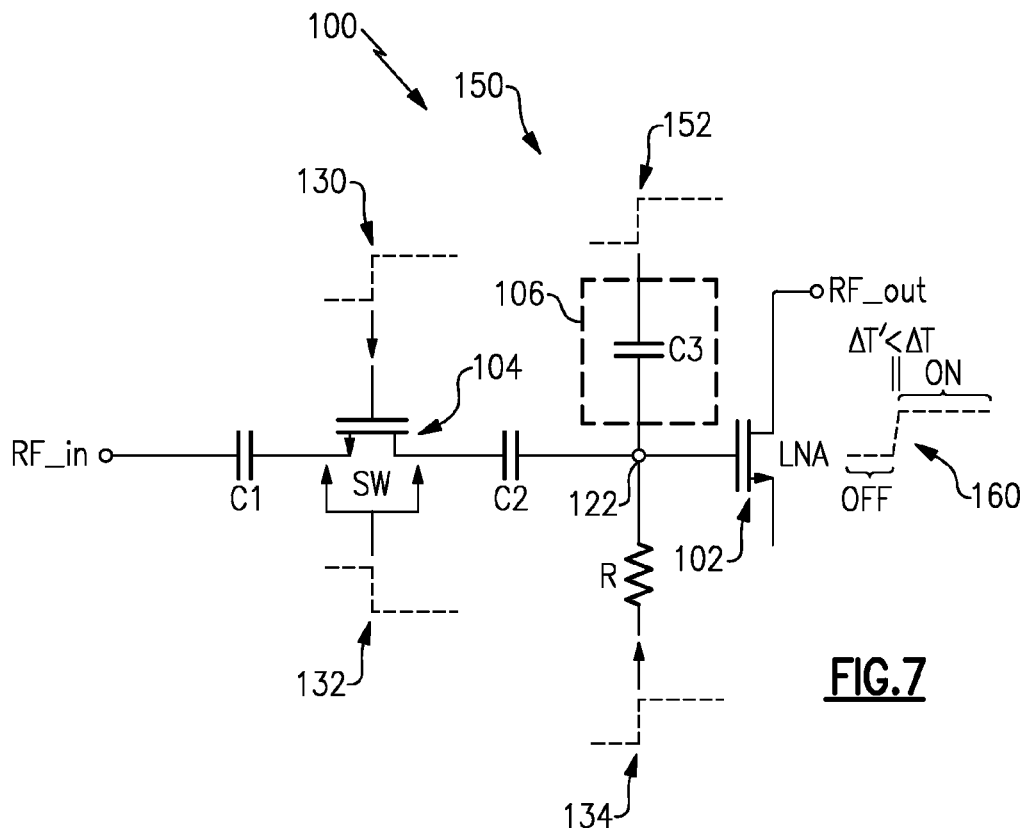
FIG. 7 shows an example configuration that can be implemented for an amplifier circuit to compensate for the example slow turn-on effect of FIG. 6.

FIG. 7 shows an example configuration 150 that can be implemented for an amplifier circuit 100 to compensate for the example slow turn-on effect of FIG. 6. Similar to the example of FIG. 6, the amplification configuration 150 of FIG. 7 is shown to include an input RF signal (RF_in) being provided to a gate of an LNA 102 (e.g., a FET) through a blocking capacitance C1, a switch 104 (SW) (e.g., a FET), and a blocking capacitance C2. The blocking capacitances C1, C2 are typically configured to provide DC-blocking functionality to isolate the DC biasing points of the switch 104 (SW) and the LNA 102. The amplified RF signal is shown to be output (RF_out) through a drain of the LNA 102.

To enable such an amplification path, the switch 104 (SW) can be turned ON by application of a positive edge signal 130. The LNA 102 can be turned ON by application of a positive edge signal 134 to the gate node 122 through, for example, a gate resistance R. The two positive edge signals 130, 134 may or may not be supplied from a common source, and their magnitudes may or may not be the same.

Similar to the example of FIG. 6, the drain and source of the FET switch 104 (SW) can be applied with a negative edge signal 132 to minimize or reduce insertion loss associated with the FET switch 104 (SW). Such a negative edge signal typically couples through the blocking capacitance C2 and counteracts the positive edge signal 134, to thereby slow down the turn-on of the LNA 102.

FIG. 7 shows that in some embodiments, a compensation circuit 106 can be implemented in the amplifier circuit 100 to compensate for a turn-on slowing effect such as the foregoing example effect of the negative edge signal 132 on the LNA 102. By way of an example, the compensation circuit 106 can include a capacitance C3 having one end connected to the gate node 122, and the other end connected to a compensation signal node. The capacitance C3 can be configured to provide DC blocking functionality for the gate node 122 such that a control signal 152 applied at the compensation signal node results in compensation for an undesirable turn-on effect on the LNA 102 resulting from one or more control signals applied associated with the enablement of the amplification path. For example, the negative edge signal 132 applied to the drain and source of the FET switch 104 (SW) is described herein as coupling through the DC blocking capacitance C2 to impact the positive edge turn-on signal 134 applied to the gate node 122. For such an example situation, the control signal 152 can be a positive edge signal that couples to the gate node 122 through the DC blocking capacitance C3 and compensates for the effect of the negative edge signal 132.

In FIG. 7, the foregoing compensation example is shown to yield a turn-on profile of the LNA 102, depicted by a trace 160 that transitions from an OFF state to an ON state through a delay period ΔT' which is less than the delay period ΔT associated with FIG. 6. In some embodiments, the compensation control signal 152 and the compensation circuit 106 can be configured so that the turn-on profile of the LNA 102 is as if the negative edge signal 132 is not applied to the drain and source of the FET switch 104 (SW). Accordingly, the example configuration 150 of FIG. 7 can allow the switch-related insertion loss to be minimized or reduced, while allowing the LNA to have a fast turn-on performance. Such a combination of performance features is desirable in RF applications such as wireless-LAN (WLAN) applications.

In the example of FIG. 7, application of a positive edge (compensation control signal 152) through a blocking capacitance (C3) is shown to cancel the charge resulting from the negative edge signal 132 applied to the switch 104 (SW). Since the compensation control signal 152 is applied through a blocking capacitance (C3), it generally does not affect the DC biasing of the switch 104 (SW) and the LNA 102. Further, the application of the compensation control signal 152 allows independent optimal biasing of the switch 104 (SW) and the LNA 102.

In the example described in reference to FIG. 7, the fast turn-on of the LNA 102 can be achieved by an application of, for example, a positive edge signal to the compensation circuit. Such a positive edge compensation signal can be similar to the LNA (102) and/or switch (104) enabling positive edge signals (134 and/or 130), where each signal can transition from a low state to a high state. Accordingly, in some embodiments, an effective fast turn-on performance for the LNA 102 can be achieved without an intermediate state (e.g., a pre-charged state) of a control signal provided to the LNA.

In the example described in reference to FIG. 7, the compensation technique includes providing a capacitive coupled positive edge signal to compensate for the effect of a capacitive coupled negative edge signal. It will be understood that if an undesirable turn-on effect results from a capacitive coupled positive edge signal, a capacitive coupled negative edge signal can be applied to provide compensation in a similar manner. Further, it will be understood that one or more features of the present disclosure can also be utilized in applications where control signals are not necessarily step functions.

In the example described in reference to FIG. 7, the compensation technique is described in the context of improvement in turn-on performance. It will be understood that one or more features of the present disclosure can also be implemented to provide improvement in turn-off performance of an amplifier.

In the example described in reference to FIG. 7, the compensation circuit 106 is described as including a DC blocking capacitance (C3) to provide a similar coupling as the capacitive coupling of a control signal that results in the slow turn-on of the LNA. It will be understood that, depending on a particular amplification path configuration, the compensation circuit 106 can be configured differently.

In the example described in reference to FIG. 7, the switch 104 and the LNA 102 are described as being FET devices. In some embodiments, such FET devices can be implemented as, for example, silicon-on-insulator (SOI) devices. Other types of FET devices can also be utilized. It will be understood that other types of transistors can also be utilized for the switch 104 and the LNA 102. It will also be understood that the switch 104 and the LNA 102 may or may not be based on similar transistor types.

In the example described in reference to FIG. 7, the amplifier 102 is described in the context of an LNA. It will be understood that one or more features of the present disclosure can also be implemented in other amplification applications, including power amplification (PA) of RF signals to be transmitted.

Figure 8:
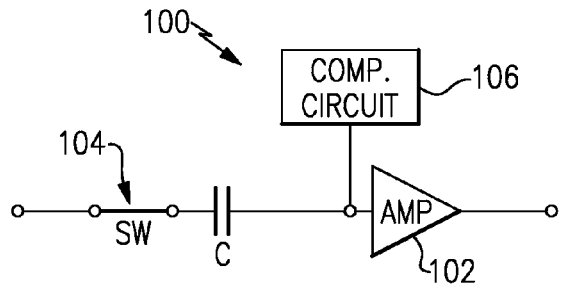
FIG. 8 shows a generalized amplification circuit, in accordance with some embodiments.

Accordingly, FIG. 8 shows a more generalized depiction of the example of FIG. 7. In FIG. 8, an amplification circuit 100 can be depicted as an amplification path that includes a switch 104, a DC blocking capacitance C, and an amplifier 102. A compensation circuit 106 having one or more features as described herein can be coupled to the amplifier 102 so as to provide compensation functionality to yield an improved turn-on performance.

FIGS. 9-15 show that in some embodiments, one or more features of the present disclosure can be implemented in amplification applications involving more than one amplifier. FIGS. 9-12 show an amplification configuration involving a plurality of stages in a given amplification path. In each of the examples of FIGS. 9-12, an amplification path is shown to include a switch 104, a DC blocking capacitance C, a first amplification stage 102a, and a second amplification stage 102b. Such an amplification path can be enabled similar to the example of FIG. 7; and the first and second amplification stages 102a, 102b can be enabled with a common signal or with separate enable signals.

Figure 9:
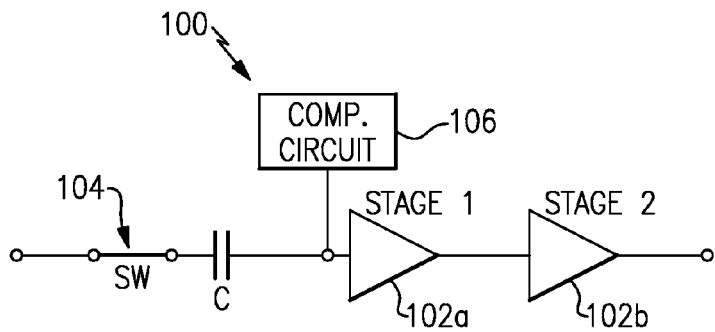
FIG. 9 shows an amplification circuit, in accordance with some embodiments, where a compensation circuit can be provided for a first stage.
Figure 10:
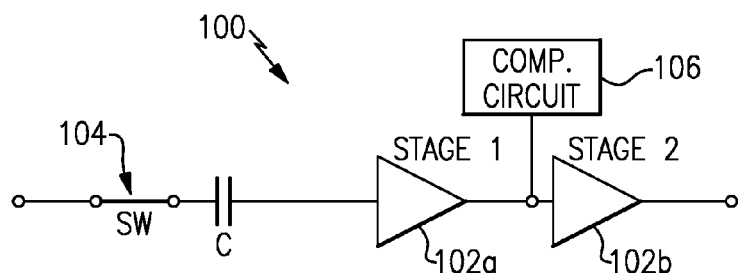
FIG. 10 shows an amplification circuit, in accordance with some embodiments, where a compensation circuit can be provided for a second stage.

FIGS. 9 and 10 show that in some embodiments, either of the first and second stages 102a, 102b can be provided with a compensation circuit 106 having one or more features as described herein. In FIG. 9, a compensation circuit 106 is shown to be provided for the first stage 102a. In FIG. 10, a compensation circuit 106 is shown to be provided for the second stage 102b.

Figure 11:
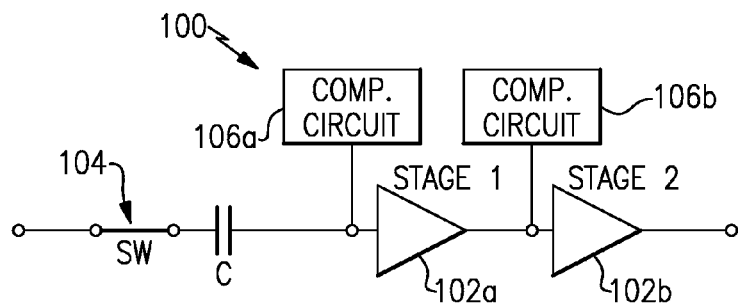
FIG. 11 shows an amplification circuit, in accordance with some embodiments, where a compensation circuit can be provided for each of first and second stages.
Figure 12:
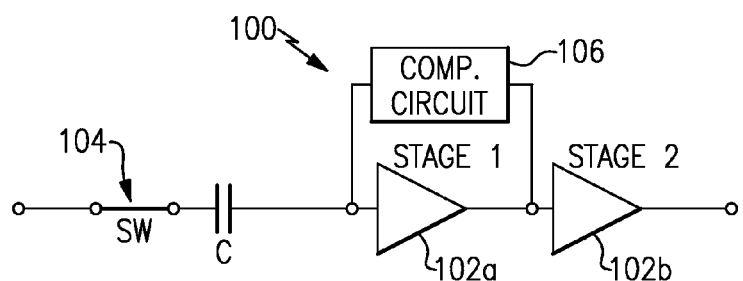
FIG. 12 shows an amplification circuit, in accordance with some embodiments, where a common compensation circuit can be provided for both of first and second stages.

FIGS. 11 and 12 show that in some embodiments, both of the first and second stages 102a, 102b can be provided with compensation functionality as described herein. In FIG. 11, each of the first and second stages 102a, 102b is shown to be provided with its own compensation circuit (106a, 106b). In FIG. 12, both of the first and second stages 102a, 102b are shown to be coupled to a common compensation circuit 106.

Figure 13:
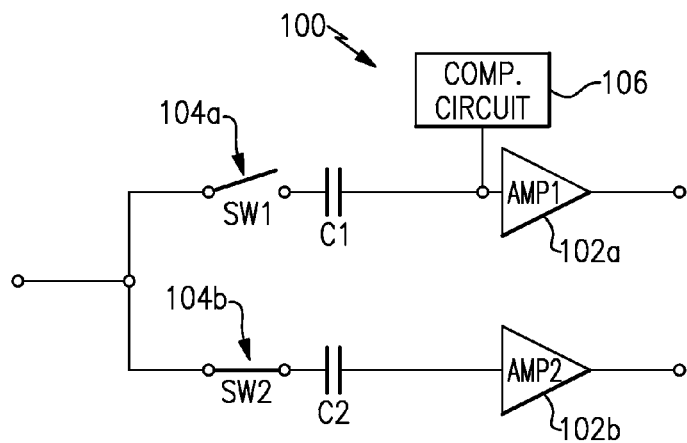
FIG. 13 shows an amplification circuit, in accordance with some embodiments, where some of a plurality of amplification paths can be provided with a compensation circuit.
Figure 14:
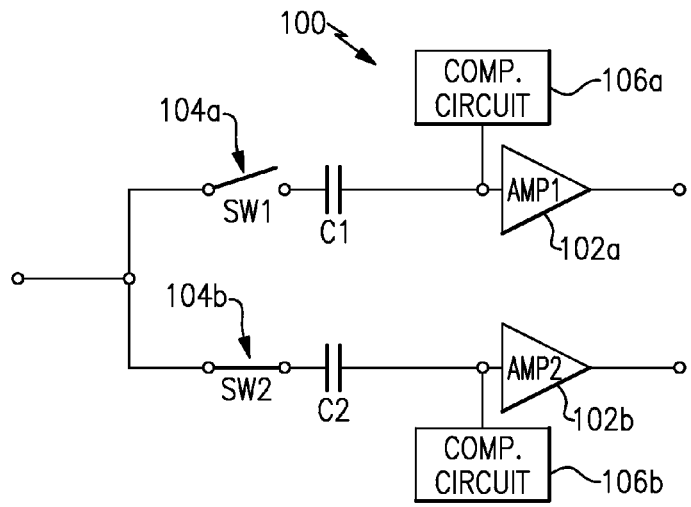
FIG. 14 shows an amplification circuit, in accordance with some embodiments, where each of a plurality of amplification paths can be provided with a separate compensation circuit.
Figure 15:
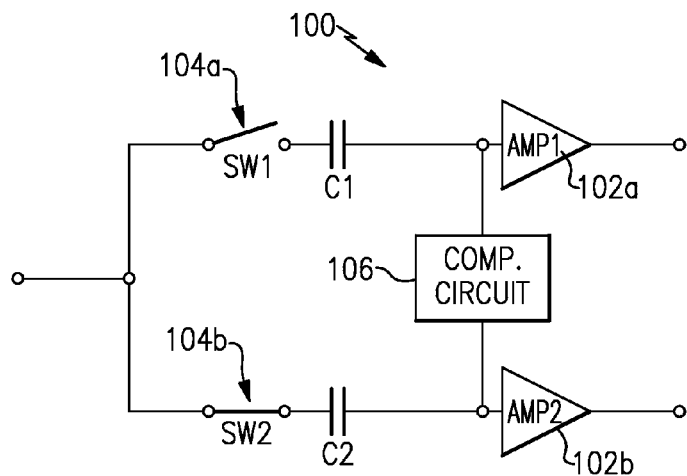
FIG. 15 shows an amplification circuit, in accordance with some embodiments, where a common compensation circuit can be provided for a plurality of amplification paths.

FIGS. 13-15 show an amplification configuration involving a plurality of amplification paths. In each of the examples of FIGS. 13-15, two amplification paths are shown to share a common input node. The first amplification path is shown to include a switch 104a (SW1), a DC blocking capacitance C1, and an amplifier 102a. Similarly, the second amplification path is shown to include a switch 104b (SW2), a DC blocking capacitance C2, and an amplifier 102b. Each of such first and second amplification paths can be enabled similar to the example of FIG. 7.

FIG. 13 shows that in some embodiments, some of a plurality of amplification paths in an amplification circuit 100 can be provided with a compensation circuit 106. For example, the first of the two amplification paths is shown to have a compensation circuit 106 coupled to the amplifier 102a.

FIGS. 14 and 15 show that in some embodiments, all of a plurality of amplification paths in an amplification circuit 100 can be provided with one or more compensation circuits. In the example of FIG. 14, each of the two amplification paths is shown to be provided with a separate compensation circuit. Accordingly, a first compensation circuit 106a is shown to be coupled to the amplifier 102a of the first amplification path, and a second compensation circuit 106b is shown to be coupled to the amplifier 102b of the second amplification path.

In the example of FIG. 15, both of the two amplification paths are shown to be coupled to a common compensation circuit 106. Such a compensation circuit can be configured to provide compensation control signals to either or both the two amplifiers 102a, 102b.

Figure 16:
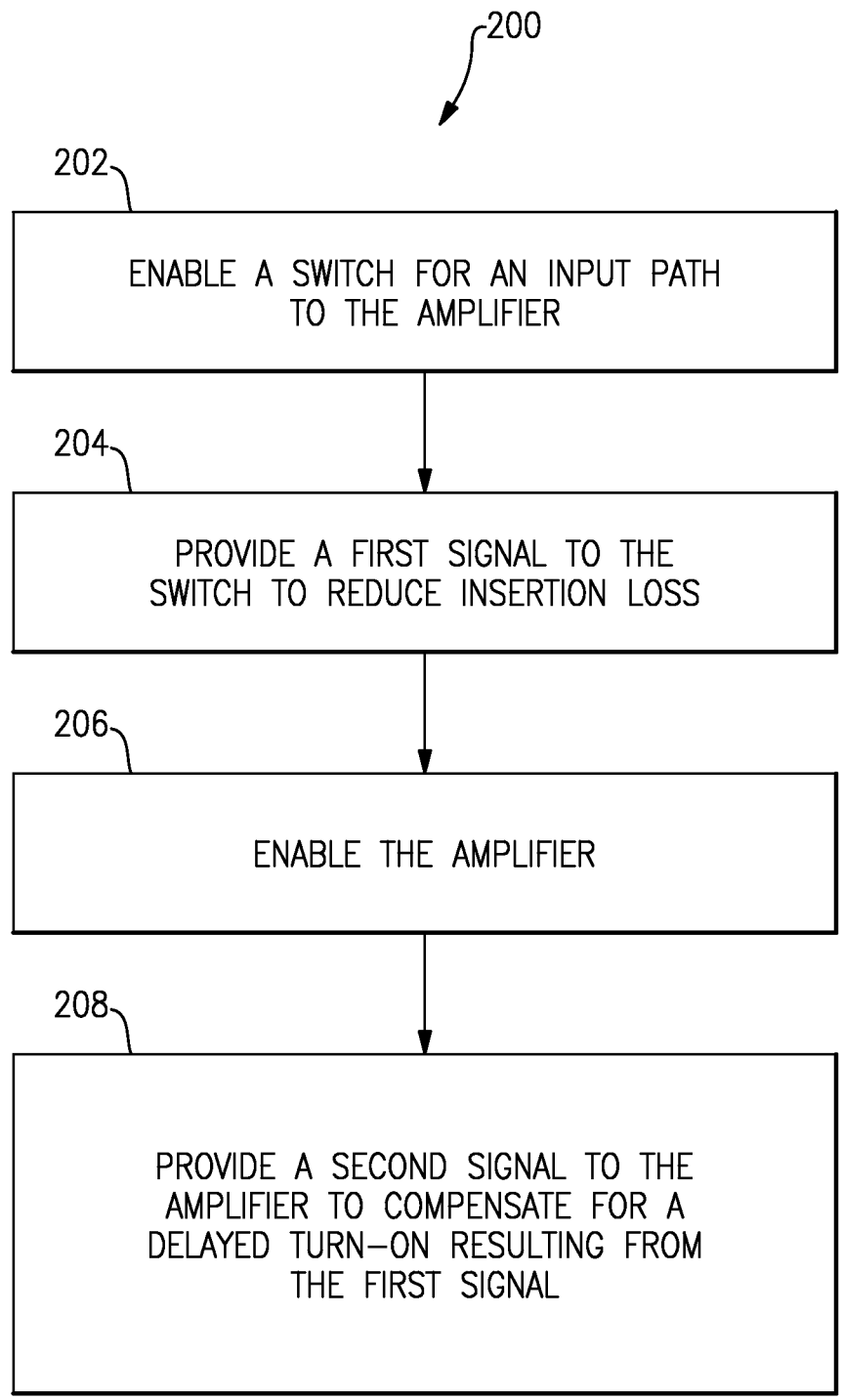
FIG. 16 shows a process that can be implemented to provide improved turn-on performance for an amplifier, in accordance with some embodiments.

FIG. 16 shows a process 200 that can be implemented to provide improved turn-on performance for an amplifier as described herein. In block 202, a switch for an input path to the amplifier can be enabled. In block 204, a first signal can be provided to the switch to reduce insertion loss. In block 206, the amplifier can be enabled. In block 208, a second signal can be provided to the amplifier to compensate for a delayed turn-on effect resulting from the first signal. In some embodiments, the foregoing signals can be applied substantially simultaneously, in a sequence, or in any manner that yields a desired effect that includes, for example, a reduced insertion loss of the switch and a faster turn-on performance of the amplifier.

Figure 17:
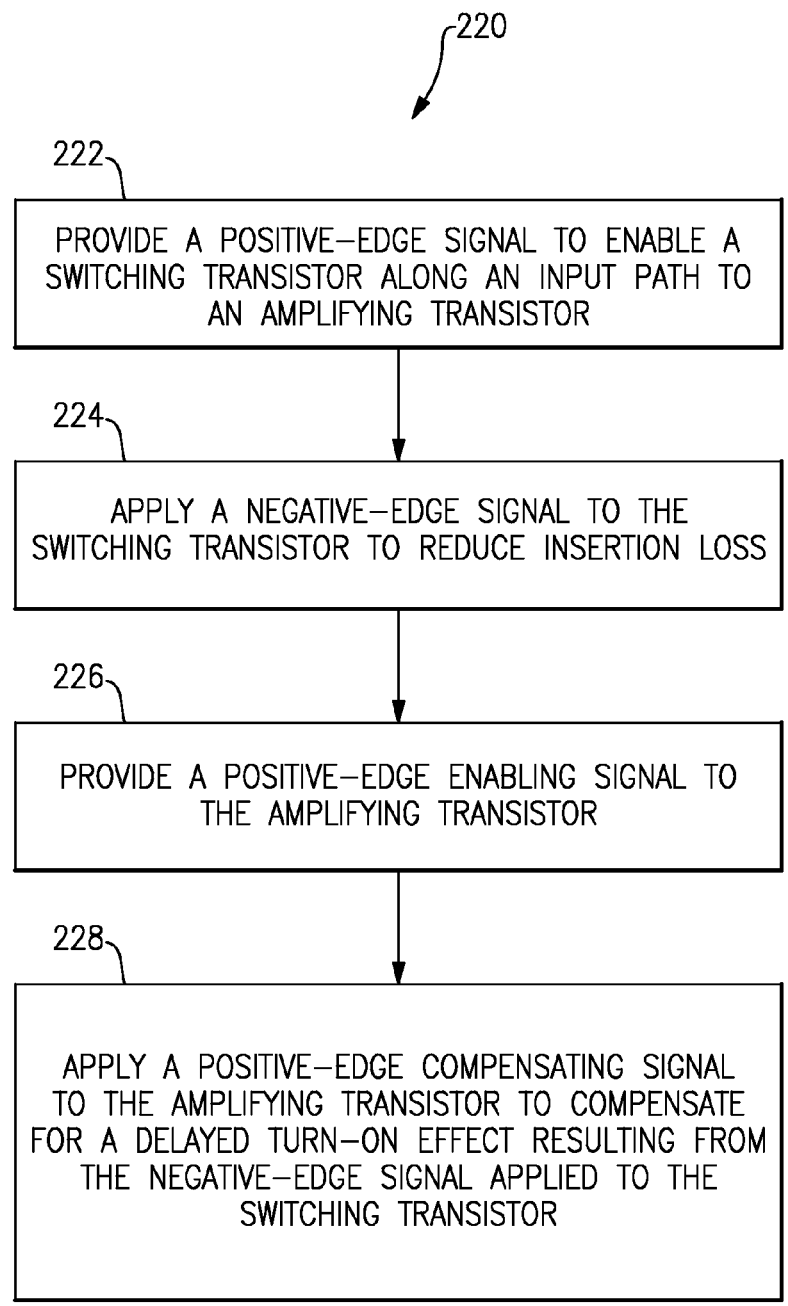
FIG. 17 shows a process that can be implemented to provide improved turn-on performance for an amplifier, in accordance with some embodiments.

FIG. 17 shows a process 220 that can be implemented as a more specific example of the process 200 of FIG. 16. In block 222 a positive edge signal can be provided to enable a switching transistor along an input path to an amplifying transistor. In block 224, a negative-edge signal can be applied to the switching transistor to reduce insertion loss. In block 226, a positive-edge enabling signal can be provided to the amplifying transistor. In block 228, a positive-edge compensating signal can be applied to the amplifying transistor to compensate for a delayed turn-on effect resulting from the negative-edge signal applied to the switching transistor. In some embodiments, the foregoing signals can be applied substantially simultaneously, in a sequence, or in any manner that yields a desired effect that includes, for example, a reduced insertion loss of the switch and a faster turn-on performance of the amplifier.

Figure 18:
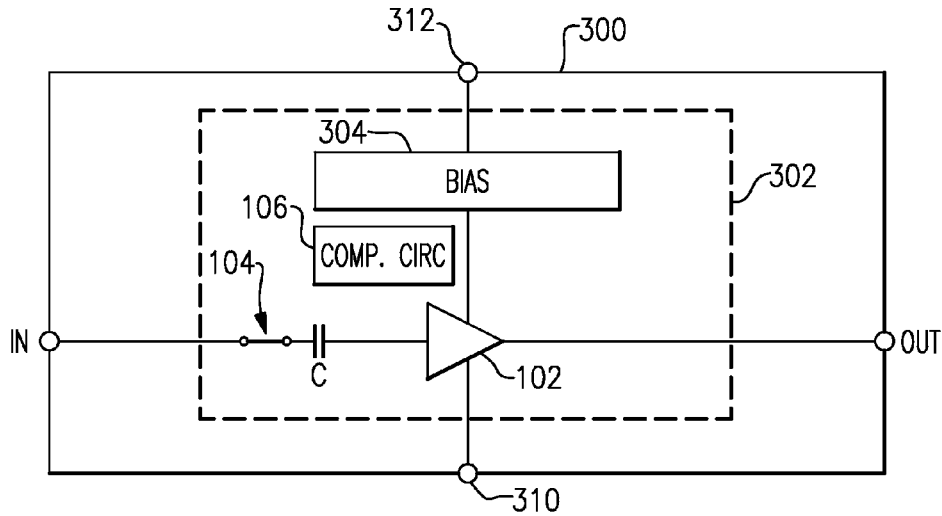
FIG. 18 shows an example RF amplifier implemented in an RF module, in accordance with some embodiments.

FIG. 18 shows that in some embodiments, an amplifier die 302 having one or more features as described herein can be implemented in an RF module 300. As described herein, an amplifier circuit implemented on such a die can include one or more stages of an amplifier 102, and one or more compensation circuits 104 for one or more stages.

The amplifier circuit can be configured to receive an RF signal through an input node (IN). More particularly, the amplifier 102 is shown to receive the RF signal through a switch 104 and a DC blocking capacitance C to provide functionalities as described herein. The amplified RF signal can be output through an OUT node. Operation of the amplifier circuit can be facilitated by, for example, supply power collectively depicted by a node 310.

The amplifier circuit implemented on the die 302 can be biased by a bias circuit 304. In some embodiments, such a bias circuit can be configured to operate in conjunction with the compensation circuit 106, independently from the compensation circuit 106, or any combination thereof. Operation of the bias circuit 304 can be facilitated by, for example, supply power, reference current, etc. collectively depicted by a node 312.

In some embodiments, the amplifier circuit can be implemented on the die 302, and the compensation circuit can be implemented on another semiconductor die. In some embodiments, some or all of the compensation circuit can also be implemented on the same die as the amplifier circuit. Such a configuration is depicted in the example die 302 of FIG. 18.

For the purpose of description, it will be understood that the die 302 can include, for example, silicon (Si), gallium arsenide (GaAs), and silicon germanium (SiGe). Other types of semiconductor die can also be utilized. It will also be understood that amplifying transistors and switching transistors as described herein can include SOI devices. Other types of transistors can be utilized for the amplifying transistors and switching transistors.

For the purpose of description, it will be understood that various DC blocking capacitances can be implemented as capacitor devices. Such capacitor devices may or may not be implemented on the same die as, for example, the amplifier 102.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 19:
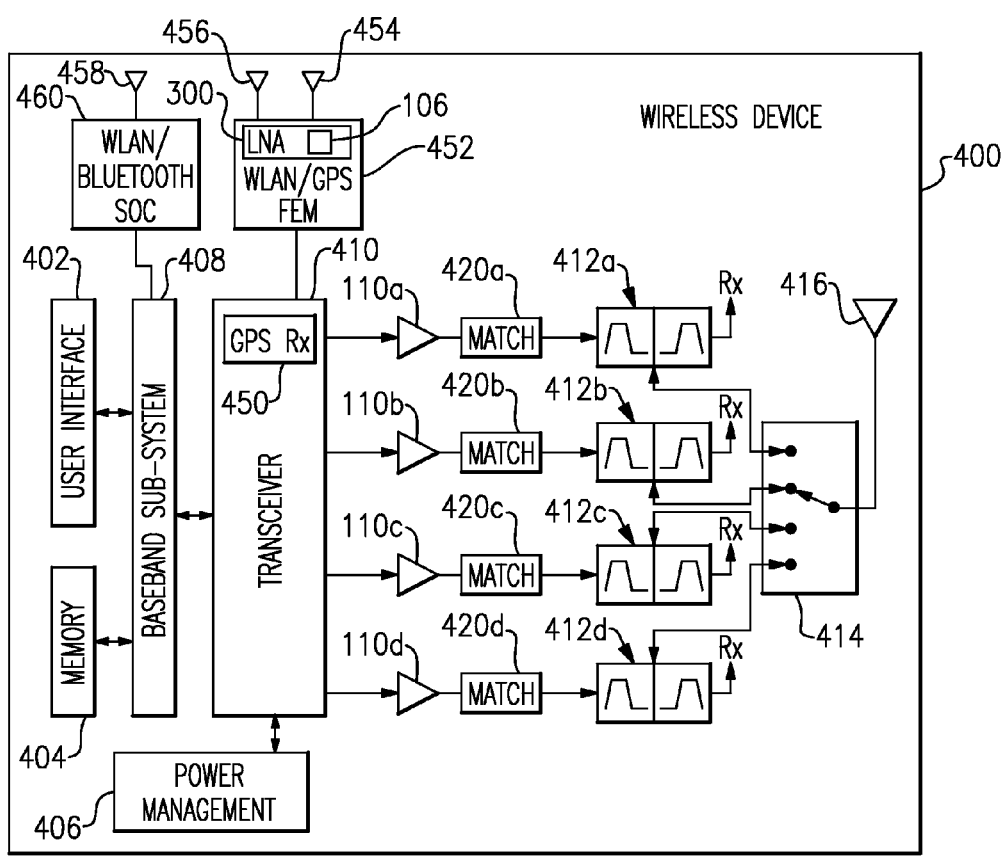
FIG. 19 shows an example wireless device having one or more advantageous features described herein.

FIG. 19 depicts an example wireless device 400 having one or more advantageous features described herein. In the context of various configurations described herein, one or more modules 300 having functionality described in reference to FIG. 18 can be included in the wireless device 400. For example, a front-end module (FEM) 452 for WLAN/GPS operations can include an LNA module 300. Such an LNA can be configured to amplify a WLAN signal received through an antenna 456. Such a WLAN signal amplified by the LNA can be provided to a transceiver 410 for processing, and then to a baseband sub-system 408. Transmission and reception of Bluetooth signals can be facilitated by an antenna 458. In the example shown, GPS functionality can be facilitated by the FEM 452 in communication with a GPS antenna 454 and a GPS receiver 450.

A power amplifier (PA) module having one or more one or more bands can be configured to amplify RF signals for transmission. Such PA paths are indicated as 110a, 110b, 110c or 110d. The PA module having such PAs can provide an amplified RF signal to the switch 414 (via the duplexer 412), and the switch 414 can route the amplified RF signal to an antenna 416.

The PA module can receive an unamplified RF signal from the transceiver 410 that can be configured and operated in known manners. The transceiver 410 can also be configured to process received signals. Such received signals can be routed to an LNA (not shown) from the antenna 416, through the duplexer 412.

The transceiver 410 is shown to interact with the baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such a power management component can also control operations of the baseband sub-system 408, as well as other components.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) amplifier circuit comprising:
an amplification path implemented to amplify an RF signal, the amplification path including a switch and an amplifier, the switch and the amplifier each configured to be ON or OFF to thereby enable or disable the amplification path, respectively; and
a compensation circuit coupled to a gate node of the amplifier, the compensation circuit configured to compensate for a slow transition of the amplifier between its ON and OFF states resulting from a signal applied to the switch.

2. The circuit of claim 1 wherein the amplification path further includes a DC blocking capacitance implemented between the switch and the amplifier.

3. The circuit of claim 2 wherein each of the switch and the amplifier includes a field-effect transistor (FET) having a gate, a source, and a drain.

4. The circuit of claim 3 wherein the FET switch is configured to be in the ON state to allow passage of the RF signal between the source and the drain upon an application of a positive edge switch signal to the gate.

5. The circuit of claim 4 wherein the FET amplifier is configured to receive the RF signal from the FET switch and the DC blocking capacitance at its gate and output the amplified RF signal through its drain or source.

6. The circuit of claim 5 wherein the amplified RF signal is output through the drain of the FET amplifier.

7. The circuit of claim 5 wherein the FET amplifier is configured to be turned ON to allow amplification of the RF signal upon an application of a positive edge signal to the gate.

8. The circuit of claim 7 wherein the signal applied to the switch includes a negative edge signal applied to the source and the drain of the FET switch to improve insertion loss performance of the FET switch, the negative edge signal coupling with the FET amplifier through the DC blocking capacitance to result in the slow transition of the FET amplifier from the OFF state to the ON state.

9. The circuit of claim 8 wherein the compensation circuit includes a DC blocking capacitance coupled to the gate of the FET amplifier.

10. The circuit of claim 9 wherein the DC blocking capacitance of the compensation circuit is configured to provide a capacitive coupling of a positive edge compensation signal to the gate of the FET amplifier to provide compensation for at least a portion of the capacitive coupled effect of the negative edge signal applied to the source and the drain of the FET switch.

11. The circuit of claim 10 wherein the compensation provided by the capacitive coupling of a positive edge compensation signal results in a faster transition of the FET amplifier from the OFF state to the ON state.

12. The circuit of claim 10 wherein the capacitive coupling of the positive edge compensation signal to the gate of the FET amplifier is configured to substantially cancel the capacitive coupled effect of the negative edge signal applied to the source and the drain of the FET switch.

13. The circuit of claim 1 wherein the amplifier includes a low-noise amplifier (LNA).

14. The circuit of claim 13 wherein the LNA is configured to amplify received WLAN signals.

15. A radio-frequency (RF) module comprising:
a packaging substrate configured to receive a plurality of components; and
an RF amplifier circuit implemented on the packaging substrate, the RF amplifier circuit including an amplification path implemented to amplify an RF signal, the amplification path including a switch and an amplifier, the switch and the amplifier each configured to be ON or OFF to thereby enable or disable the amplification path, respectively, the RF amplifier circuit further including a compensation circuit coupled to a date node of the amplifier, the compensation circuit configured to compensate for a slow transition of the amplifier between its ON and OFF states resulting from a signal applied to the switch.

16. The RF module of claim 15 wherein the RF module is a WLAN module.

17. A wireless device comprising:
an antenna configured to facilitate transmission and receive operations; and
an RF amplifier circuit in communication with the antenna, the RF amplifier circuit including an amplification path implemented to amplify an RF signal, the amplification path including a switch and an amplifier, the switch and the amplifier each configured to be ON or OFF to thereby enable or disable the amplification path, respectively, the RF amplifier circuit further including a compensation circuit coupled to a gate node of the amplifier, the compensation circuit configured to compensate for a slow transition of the amplifier between its ON and OFF states resulting from a signal applied to the switch.

18. The wireless device of claim 17 wherein the amplifier is a low-noise amplifier (LNA) and the amplification path is configured to amplify the RF signal received through the antenna.

19. The wireless device of claim 18 wherein the RF amplifier circuit further includes a power amplifier (PA) path configured to amplify an RF signal to be transmitted.

20. The wireless device of claim 19 wherein the amplification path and the PA path are each coupled to the antenna.

* * * * *